United States Patent

Miyamoto et al.

(10) Patent No.: US 7,061,715 B2
(45) Date of Patent: Jun. 13, 2006

(54) DISK ARRAY APPARATUS

(75) Inventors: Kenichi Miyamoto, Odawara (JP); Yasuji Morishita, Odawara (JP); Yasuyuki Katakura, Odawara (JP); Shigeaki Tanaka, Odawara (JP); Yoshikatsu Kasahara, Naka (JP)

(73) Assignee: Hitachi, Ltd., Tokyo (JP)

( * ) Notice: Subject to any disclaimer, the term of this patent is extended or adjusted under 35 U.S.C. 154(b) by 211 days.

(21) Appl. No.: 10/766,206

(22) Filed: Jan. 29, 2004

(65) Prior Publication Data

US 2005/0111136 A1    May 26, 2005

(30) Foreign Application Priority Data

Nov. 20, 2003    (JP) .............................. 2003-390209

(51) Int. Cl.
*G11B 33/14*    (2006.01)

(52) U.S. Cl. .................................... 360/97.03; 361/687

(58) Field of Classification Search ............ 360/97.03, 360/97.02, 98.01; 361/683, 684, 687, 695
See application file for complete search history.

(56) References Cited

U.S. PATENT DOCUMENTS

| | | | |
|---|---|---|---|
| 4,158,875 A * | 6/1979 | Tajima et al. ................ 361/695 |
| 4,774,631 A * | 9/1988 | Okuyama et al. ............ 361/695 |
| 5,173,819 A * | 12/1992 | Takahashi et al. ........ 360/97.03 |
| 5,237,484 A | 8/1993 | Ferchau et al. |
| 5,544,012 A * | 8/1996 | Koike ......................... 361/695 |
| 5,751,549 A | 5/1998 | Eberhardt et al. |
| 6,018,456 A * | 1/2000 | Young et al. ................ 361/684 |
| 6,374,627 B1 * | 4/2002 | Schumacher et al. ....... 62/259.2 |
| 6,424,526 B1 | 7/2002 | Heard |
| 6,496,366 B1 * | 12/2002 | Coglitore et al. ........... 361/687 |
| 6,563,706 B1 | 5/2003 | Strickler |
| 6,621,693 B1 | 9/2003 | Potter et al. |
| 6,672,955 B1 * | 1/2004 | Charron ....................... 454/184 |
| 6,819,560 B1 | 11/2004 | Konshak et al. |
| 6,850,408 B1 * | 2/2005 | Coglitore et al. ........... 361/683 |
| 6,859,366 B1 * | 2/2005 | Fink ............................ 361/690 |
| 6,867,967 B1 * | 3/2005 | Mok ............................ 361/687 |
| 2002/0105782 A1 | 8/2002 | Huang |
| 2004/0037034 A1 | 2/2004 | Suzuki et al. |

FOREIGN PATENT DOCUMENTS

| | | |
|---|---|---|
| JP | 02-098197 | 10/1988 |
| JP | 02-266599 | 4/1989 |
| JP | 2001-332078 | 5/2000 |

* cited by examiner

*Primary Examiner*—Angel Castro
(74) *Attorney, Agent, or Firm*—Reed Smith LLP; Stanley P. Fisher, Esq.; Juan Carlos A. Marquez, Esq.

(57) ABSTRACT

Aligned disk drives are installed in a disk box nearly taking a rectangular shape. Every two of the disk boxes are paired and accommodated in a rack in a multi-stage form. Each pair of disk boxes are disposed with their exhaust planes opposed to each other with a gap therebetween. An air intake plane of each disk box opposite to the exhaust is disposed on a front or rear side of the rack. A draft path, having front and rear walls formed by gaps between disk boxes and side walls on left and right planes of the rack, is formed in the rack center. Exhaust fans disposed on top of the rack and having air intake ports nearly equivalent in dimension to a section of the draft path suck in air through the intake and exhaust planes and draft path, and exhaust the air outside the rack.

7 Claims, 16 Drawing Sheets

DISK ARRAY APPARATUS

CROSS-REFERENCE TO RELATED APPLICATION

Japanese Patent Application No. 2003-390209 applied on Nov. 20, 2003 are cited to support the present invention.

BACKGROUND OF THE INVENTION

The present invention relates to disk array apparatuses.

In disk array apparatuses used as storage apparatuses in information processing systems, a larger number of disk drives are accommodated because of a demand for an increased storage capacity and higher performance. As a result, the disk array apparatuses are becoming large in scale. Such a disk array apparatus is disclosed in, for example, JP-A-2001-332078.

SUMMARY OF THE INVENTION

On the other hand, the demand for size reduction is also strong for disk array apparatuses for the purpose of effectively using the installation space. The disk array apparatuses are becoming high in density. Therefore, a technique for emitting heat generated in the disk array apparatus to the outside efficiently and cooling the disk array apparatus efficiently is demanded.

The present invention has been achieved in order to solve the above-described problems. A main object of the present invention is to provide a disk array apparatus having an increased cooling efficiency.

In order to achieve the object, a disk array apparatus according to the present invention includes: a plurality of disk boxes each nearly taking the shape of a rectangular solid, and each having an air intake plane through which air flows in and an exhaust plane provided at an end opposite to that of the air intake plane, a plurality of disk drives being capable of being aligned and installed in each of the disk boxes; an enclosure or a rack nearly taking the shape of a rectangular solid, disk units being accommodated in the rack so as to form a plurality of stages in a vertical direction, each of the disk units being formed by putting two of the side boxes side by side via a gap in a horizontal direction with the exhaust planes respectively of the two disk boxes being opposed to each other, ventilation being possible through planes of the rack respectively opposed to the air intake planes of the disk boxes; and an exhaust device disposed in an upper portion of the rack, air within the rack being sucked in by the exhaust device with the air being passed through the air intake planes and exhaust planes of the disk boxes and a draft path formed in the gap so as to be opened consecutively in the suction direction, and being exhausted to the outside by the exhaust device, wherein the exhaust device is disposed with a nearly entire surface of air intake ports of the exhaust device facing the draft path.

According to such a mode, the air exhausted from the exhaust planes of the disk boxes, which has cooled the inside of the disk boxes, can be sucked in by the exhaust device in a nearly straight line manner through the draft path formed in the gap. As a result, the draft resistance in the disk array apparatus can be decreased, and the cooling efficiency of the disk array apparatus can be improved.

Furthermore, since the cooling efficiency is improved, it also becomes possible to reduce the size of the exhaust device. It also becomes possible to reduce the power dissipation, noise, cost and space of the disk array apparatus. In addition, the gap between two opposed disk boxes can be used effectively as a suction space required for the exhaust devices to suck in the air.

Since it thus becomes unnecessary to provide a dedicated suction space, it becomes possible to reduce the size of the disk array apparatus in the height direction accordingly.

Besides, problems and methods for solving the problems disclosed by the present invention will be clarified by the description and drawings.

DESCRIPTION OF THE EMBODIMENT

Configuration of Disk Array Apparatus

Figure 1:
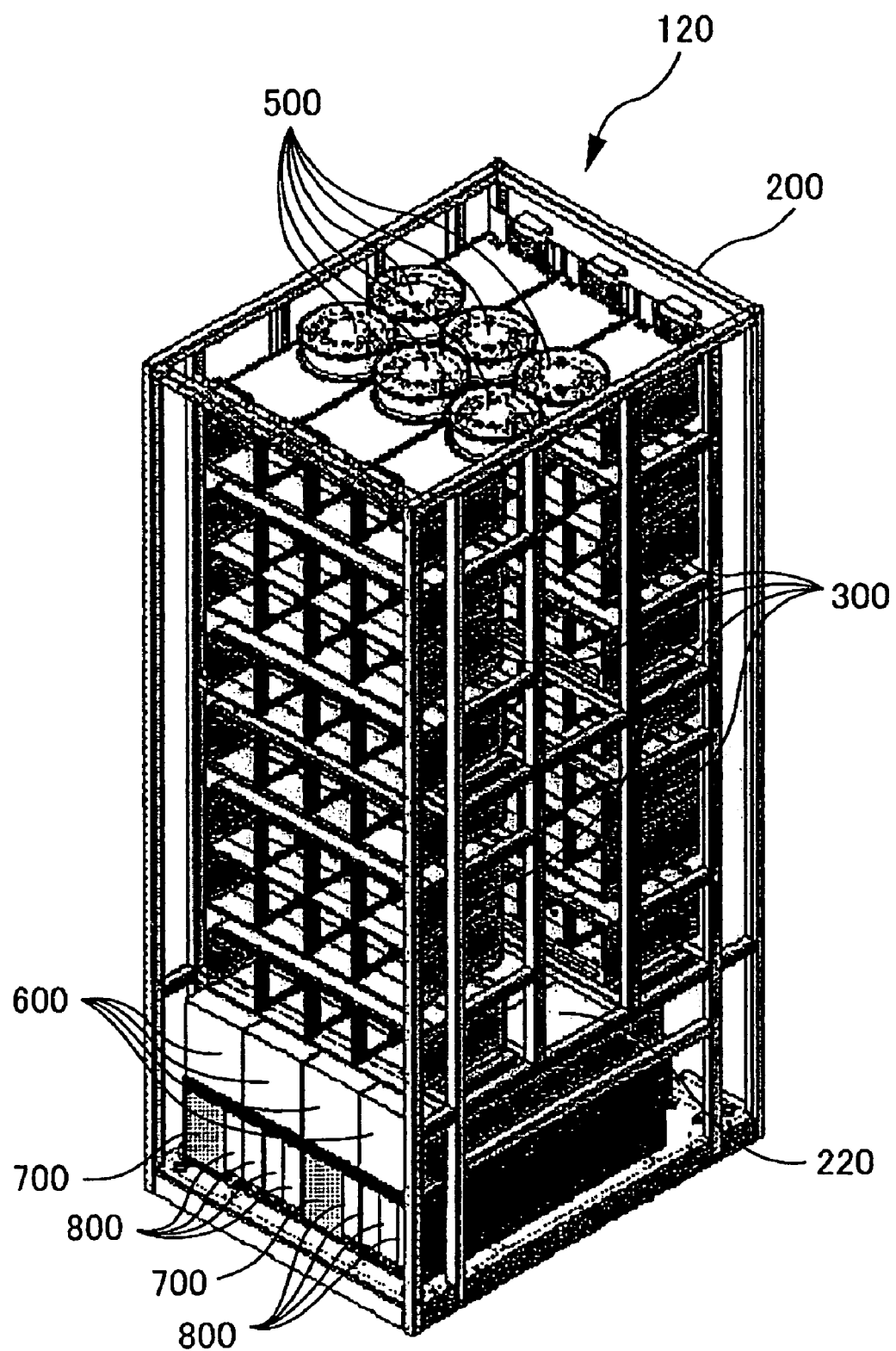
FIG. 1 is a diagram showing an exterior view configuration of a disk array apparatus according to an embodiment of the present invention.

First, a configuration of a disk array apparatus 120 according to the present embodiment will now be described with reference to FIGS. 1 to 4.

The disk array apparatus 120 includes disk drive modules (disk boxes) 300, batteries 800, AC-boxes 700, DC power supplies 600, fans (exhausters) 500, and air ducts 210, and an enclosure on a rack 200 for accommodating those components.

Figure 2:
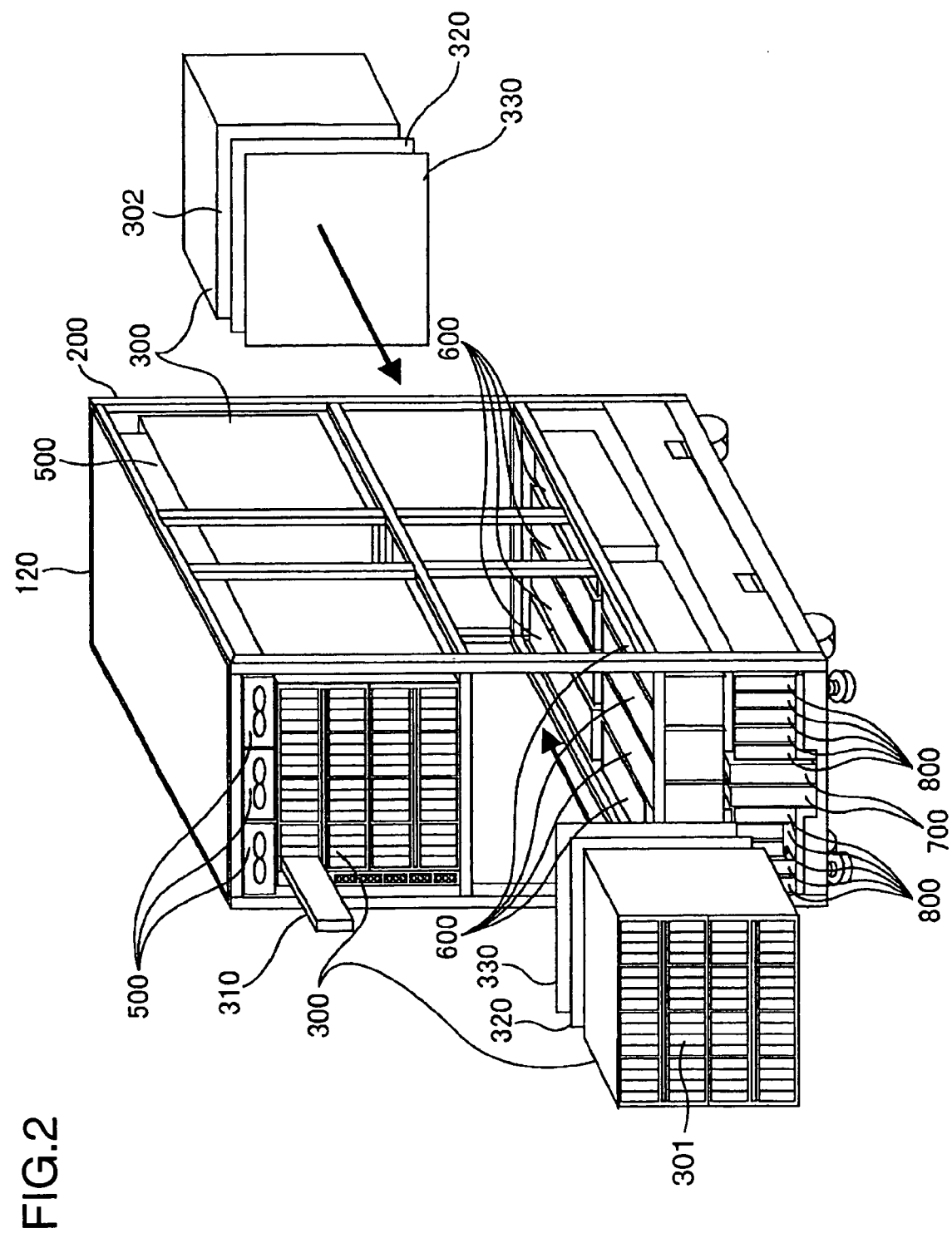
FIG. 2 is a diagram showing an exterior view configuration of a disk array apparatus according to the present embodiment.
Figure 3:
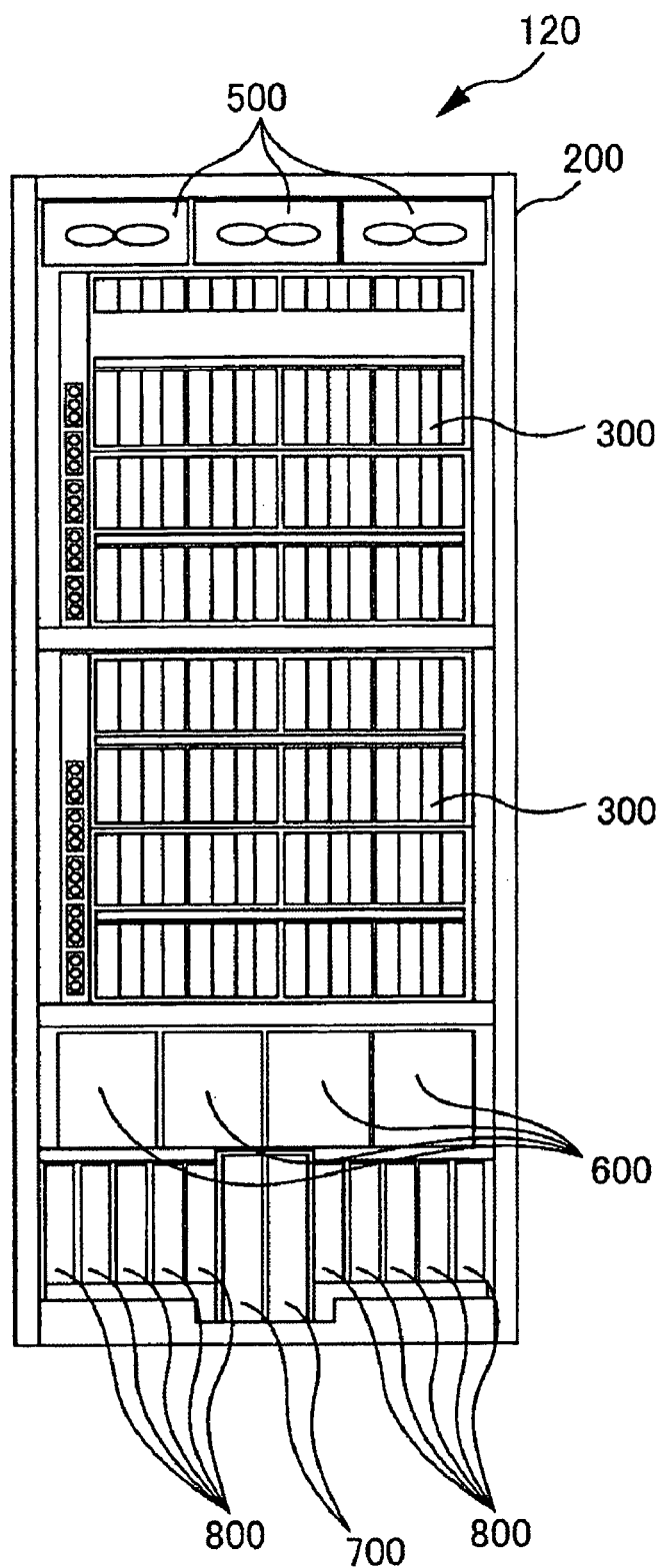
FIG. 3 is a diagram showing an exterior view configuration of a disk array apparatus according to the present embodiment.
Figure 4:
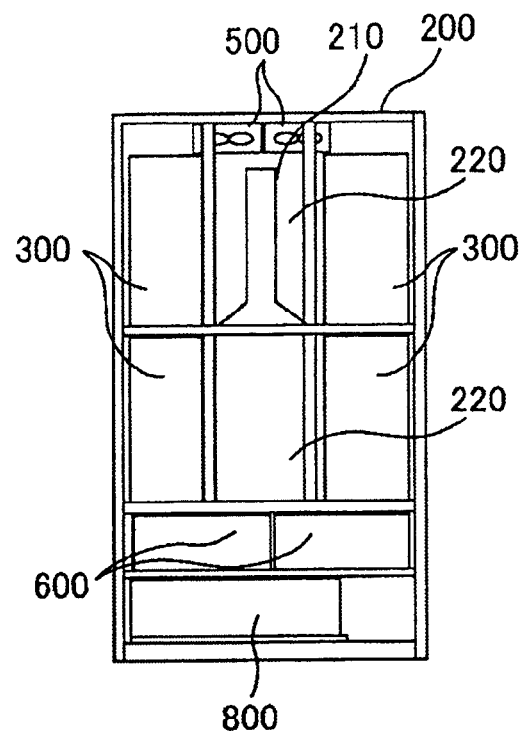
FIG. 4 is a diagram showing an internal configuration of a disk array apparatus according to the present embodiment.

FIG. 1 shows an exterior oblique view diagram of the disk array apparatus 120. FIG. 2 shows how the disk drive modules 300 are accommodated in the rack 200 of the disk array apparatus 120. FIG. 3 is a diagram showing an exterior view of the disk array apparatus 120 obtained by viewing it from the front. FIG. 4 shows an internal configuration of the disk array apparatus 120.

The rack 200 of the disk array apparatus 120 is broadly divided into three stages, i.e., an upper stage, a middle stage and a lower stage. The disk drive modules 300 are accommodated in the upper stage and the middle stage of the rack 200 with a pair of disk drive modules 300 opposed to each other in the horizontal direction via a gap 220. In other words, the disk drive modules 300 are accommodated in the upper stage and the middle stage of the rack 200 from the front side and the back side of the rack so as to have a multi-stage arrangement in the vertical direction. Hereafter, two disk drive modules 300 arranged in the horizontal direction are referred to as disk unit as well. The disk units in the upper stage need not necessarily be the same as the disk units in the lower stage.

Each of the disk drive modules 300 nearly takes the shape of a rectangular solid. And a plurality of disk drives 310 can be aligned and accommodated in each of the disk drive modules 300 in a multi-stage form so as to be capable of being installed and removed. Although details will be described later, each of the disk drive modules 300 has an air intake plane 301 through which air flows in, and an exhaust plane 302 opposite to the air intake plane 301. And each of the disk units is formed by putting two disk drive modules 300 side by side with the exhaust planes 302 of the two disk drive modules 300 being opposed to each other.

Furthermore, the rack 200 accommodating the disk drive modules 300 nearly takes the shape of a rectangular solid. And the rack 200 is formed so as to allow ventilation through its planes respectively opposed to the air intake planes 301 of the disk drive modules 300. Therefore, each of the disk drive modules 300 can take in air existing outside the rack 200 from its air intake plane 301, and exhaust the air from its exhaust plane 302.

Figure 10:
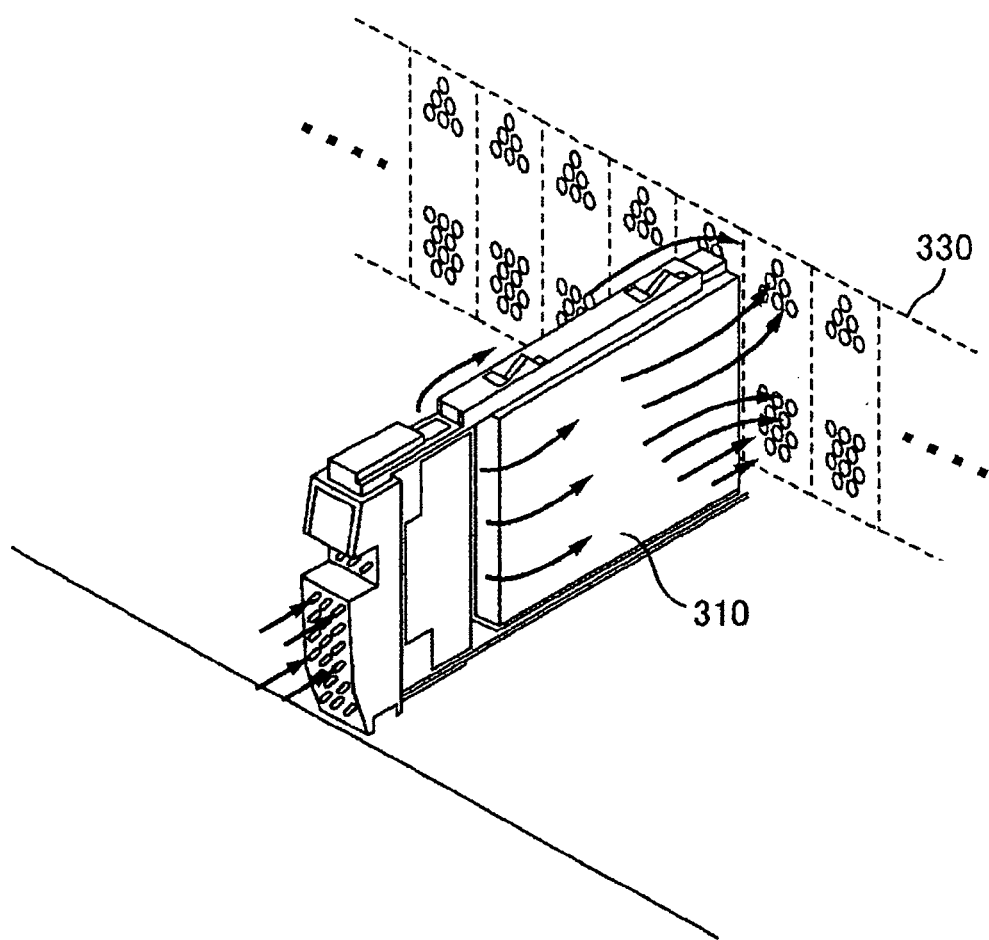
FIG. 10 is a diagram showing how cooling wind flows according to the present embodiment.

The disk drive 310 is a device including a recording medium (disk) to record data. For example, the disk drive 310 may be a hard disk device. An exterior view configuration of the disk drive unit 310 is shown in FIG. 10.

As shown in FIG. 2, a circuit board 320 and a flow straightening plate (resistance body) 330 are disposed behind the exhaust plane 302 of the disk drive module 300. The circuit board 320 is disposed between the disk drive module 300 and the flow straightening plate 330.

Figure 6:
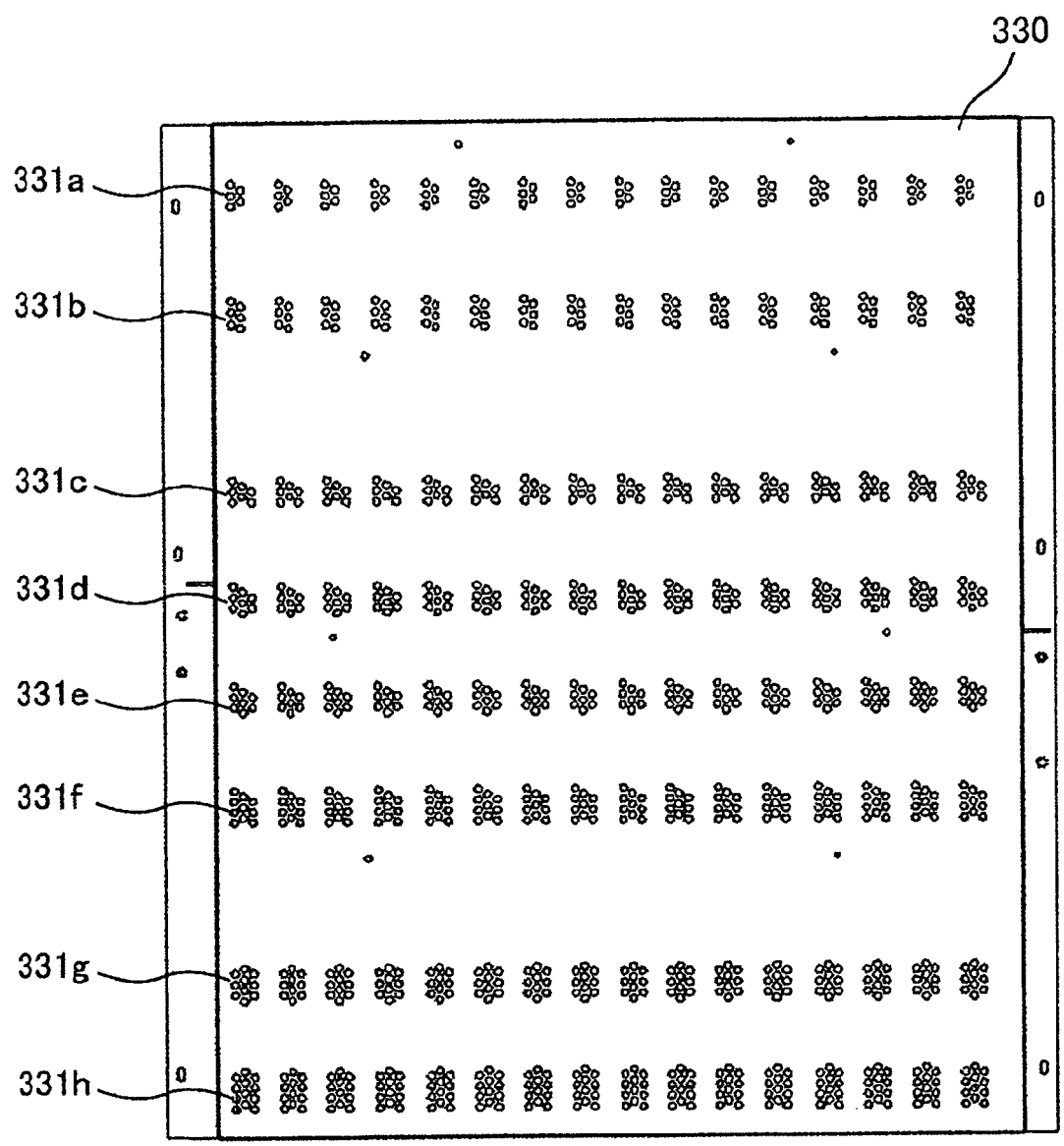
FIG. 6 is a diagram showing an exterior view configuration of a flow straightening plate according to the present embodiment.
Figure 8:
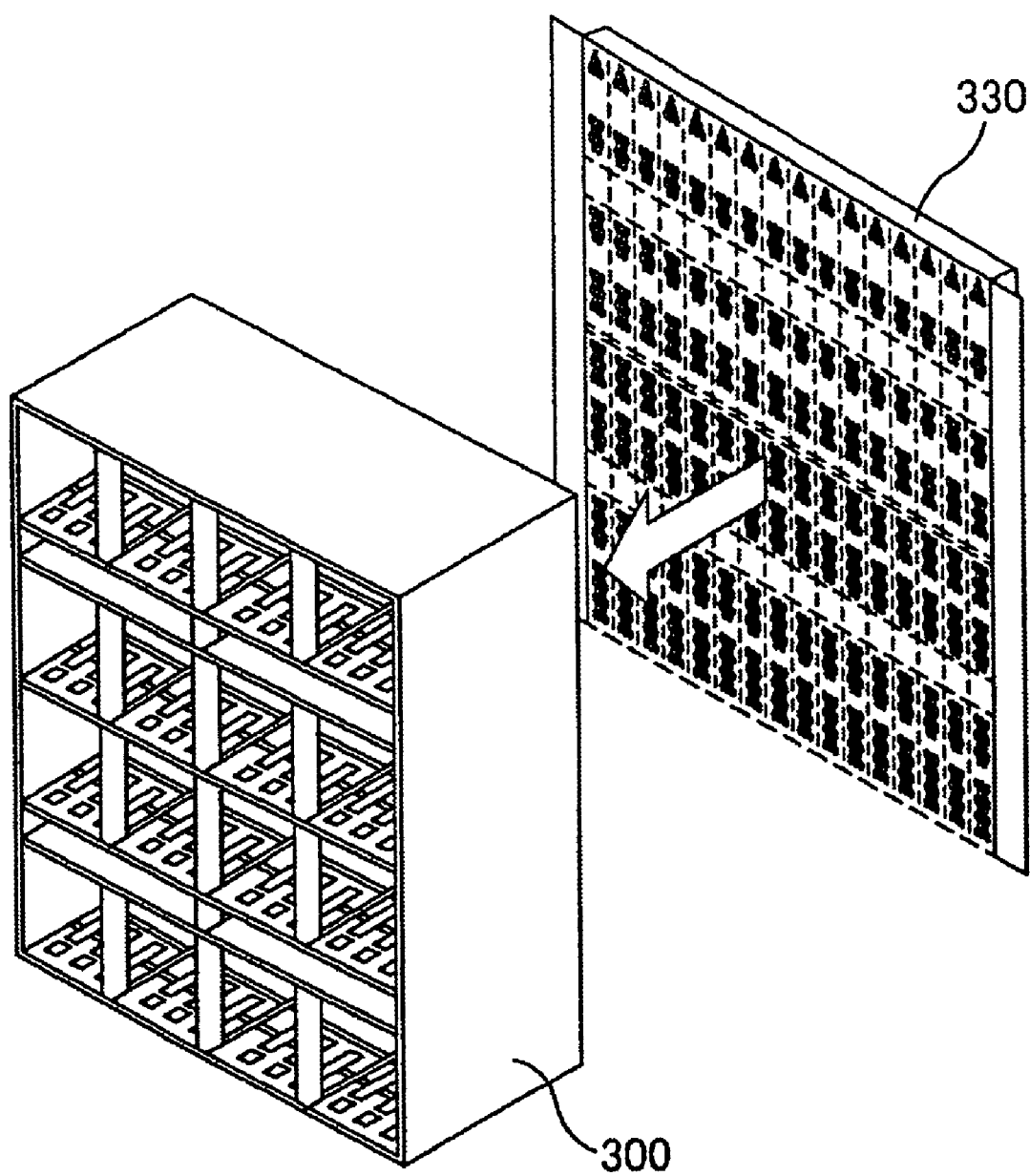
FIG. 8 is a diagram showing how a flow straightening plate is attached to a disk drive module according to the present embodiment.

As shown in FIG. 6, the flow straightening plate 330 includes vent holes 331. As a result, the flow rate of air from the exhaust plane 302 of the disk drive module 300 can be adjusted. FIG. 8 shows how the flow straightening plate 330 is disposed behind the disk drive module 300. Although the circuit board 320 is not illustrated in FIG. 8, the circuit board 320 is disposed between the disk drive module 300 and the flow straightening plate 330 as described above.

On the circuit board 320, connectors 321 for electrically connecting the disk drives 310 are provided. When a disk drive 310 has been installed in the disk drive module 300, a connector provided on the disk drive 310 and the connector 321 provided on the circuit board 320 are connected to each other, and the disk drive 310 and the circuit board 320 can be electrically connected to each other. As a result, it becomes possible to supply electric power to the disk drive 310 and control the disk drive 310.

Figure 7:
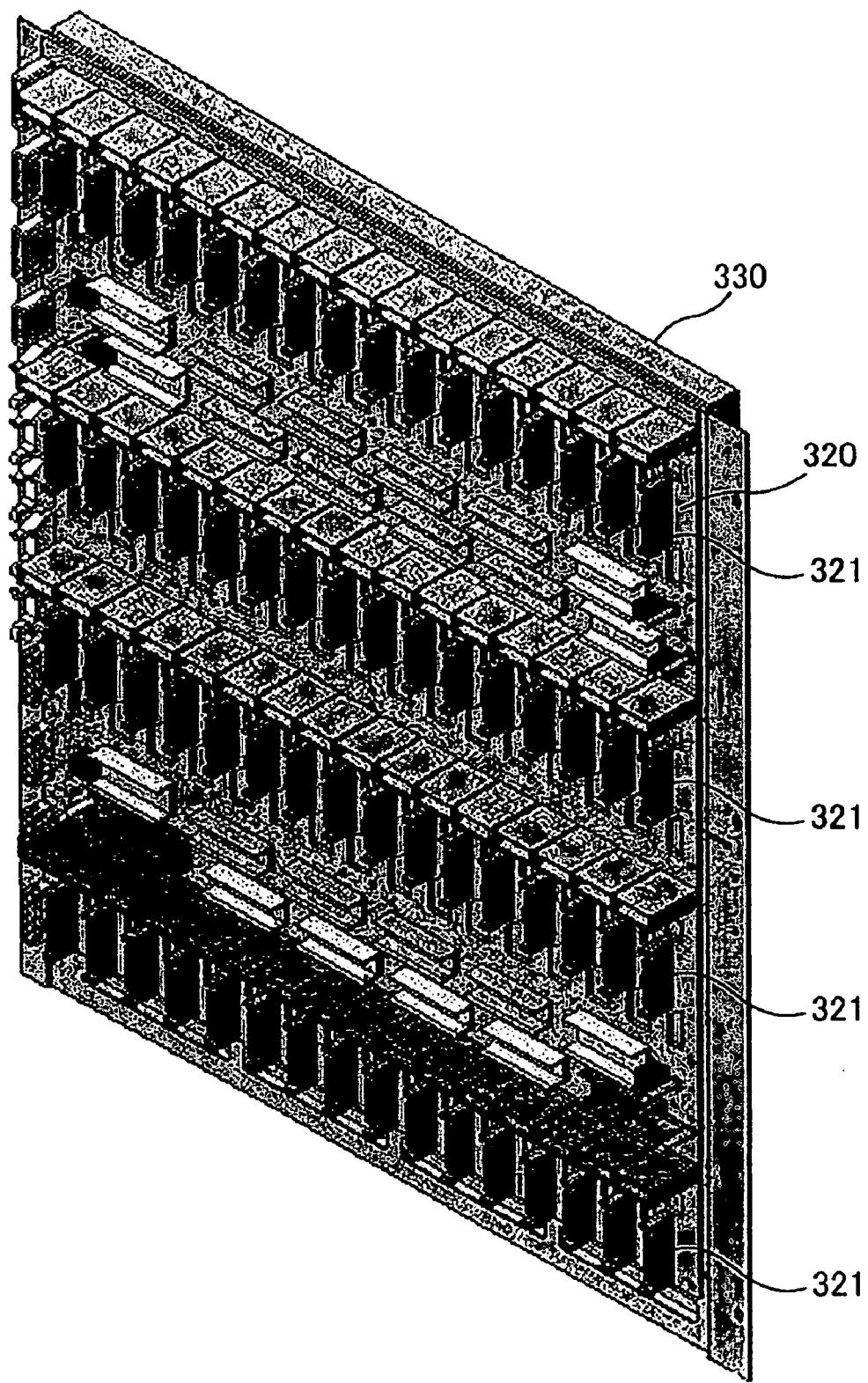
FIG. 7 is a diagram showing a flow straightening plate and a circuit board according to the present embodiment.
Figure 9:
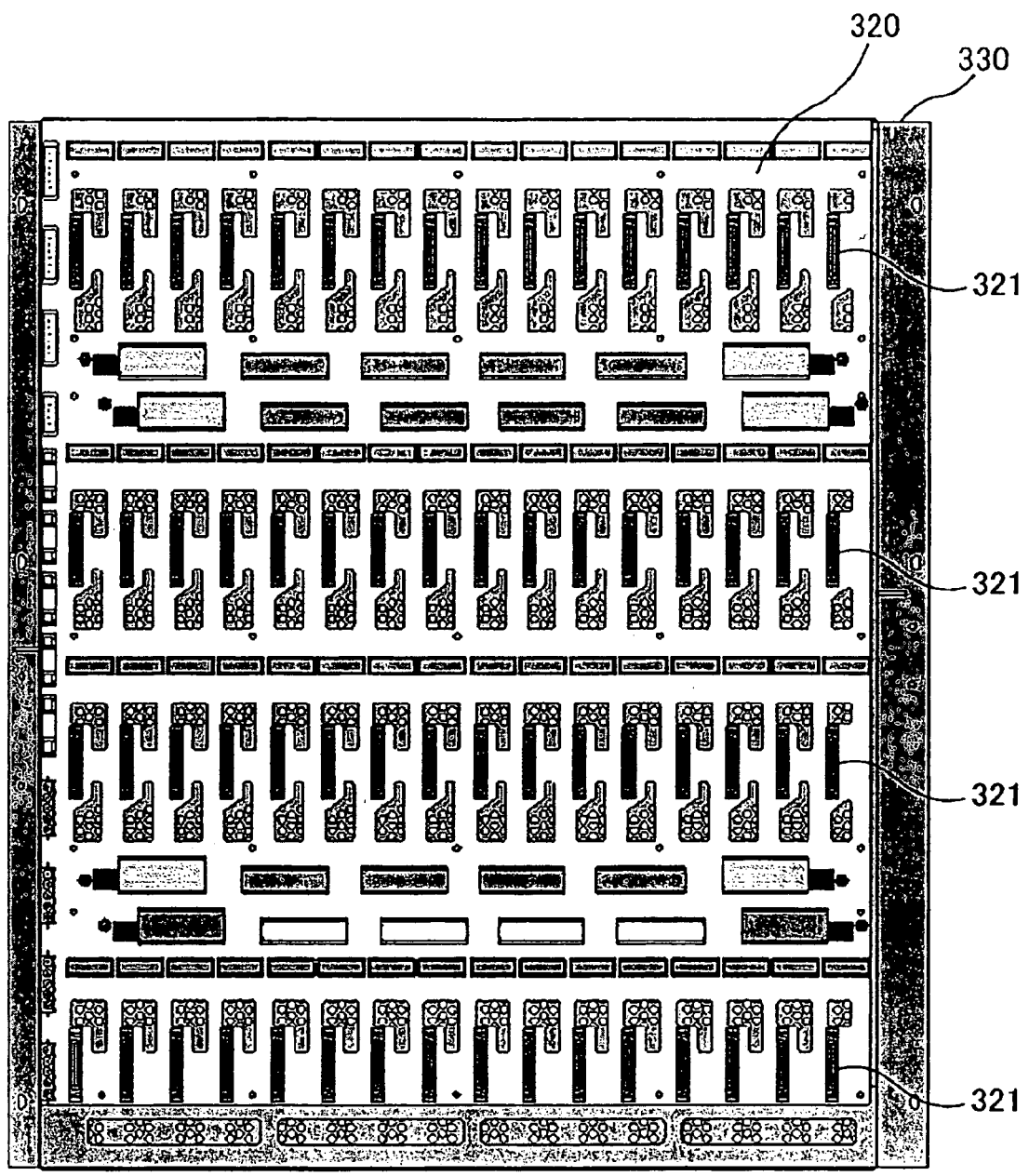
FIG. 9 is a diagram showing a state in which a flow straightening plate and a circuit board are superposed according to the present embodiment.

In the circuit board 320, holes for passing the air contained within the disk drive module 300 are provided. FIG. 7 shows an exterior view diagram obtained when the circuit board 320 and the flow straightening plate 330 are superposed and viewed from an oblique direction. FIG. 9 shows a front view diagram obtained when the circuit board 320 and the flow straightening plate 330 are superposed and viewed from the circuit board 320 side. In a state in which the flow straightening plate 330 and the circuit board 320 are superposed, the vent holes 331 provided in the flow straightening plate 330 can be seen respectively through holes provided in the circuit board 320. In other words, in a state the flow straightening plate 330 and the circuit board 320 are disposed behind the exhaust plane of the disk drive module 300, air exhausted from the exhaust plane 302 of the disk drive module 300 is exhausted to the gap between the disk drive modules 300 through the holes provided in the circuit board 320 and the vent holes 331 provided in the flow straightening plate 330.

If the flow straightening plate 330 is made of metal and the circuit board 320 is disposed between the disk drive module 300 and the flow straightening plate 330, the electromagnetic wave generated from the circuit board 320 can be shielded by the flow straightening plate 330. Furthermore, generation of static charge can be suppressed. As a result, the reliability of the disk array apparatus 120 can be improved.

In addition, the strength of the disk drive module 300 can be improved by disposing the flow straightening plate 330 behind the disk drive module 300.

The batteries 800, the AC-boxes 700 and the DC power supplies 600 are accommodated in the lower stage of the rack 200.

AC-boxes 700 serve as an inlet for taking in AC power to the disk array apparatus 120, and function as a breaker. The AC power taken in by the AC-boxes 700 is supplied to the DC power supplies 600.

The DC power supplies 600 are power supply devices for converting the AC power to DC power, and supplying the DC power to the disk drives 310 and so on.

The batteries 800 are stand-by power supply devices for supplying power to electronic devices, such as the disk drive 310, included in the disk array apparatus 120, in place of the DC power supplies 600 at the time of a power failure or when a trouble has occurred in the DC power supplies 600.

The fans 500 are disposed on an upper part of the rack. The fans cool the disk array apparatus 120 by sucking in air contained in the rack 200 and exhausting the air to the outside. For example, axial-flow fans can be used as the fans 500.

Cooling of Disk Array Apparatus

Figure 5:
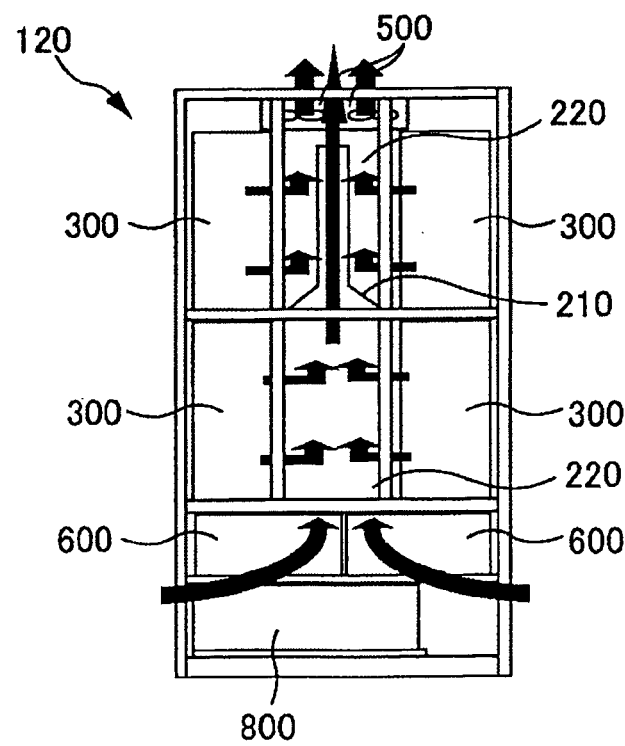
FIG. 5 is a diagram showing draft paths in a disk array apparatus according to the present embodiment.
Figure 21:
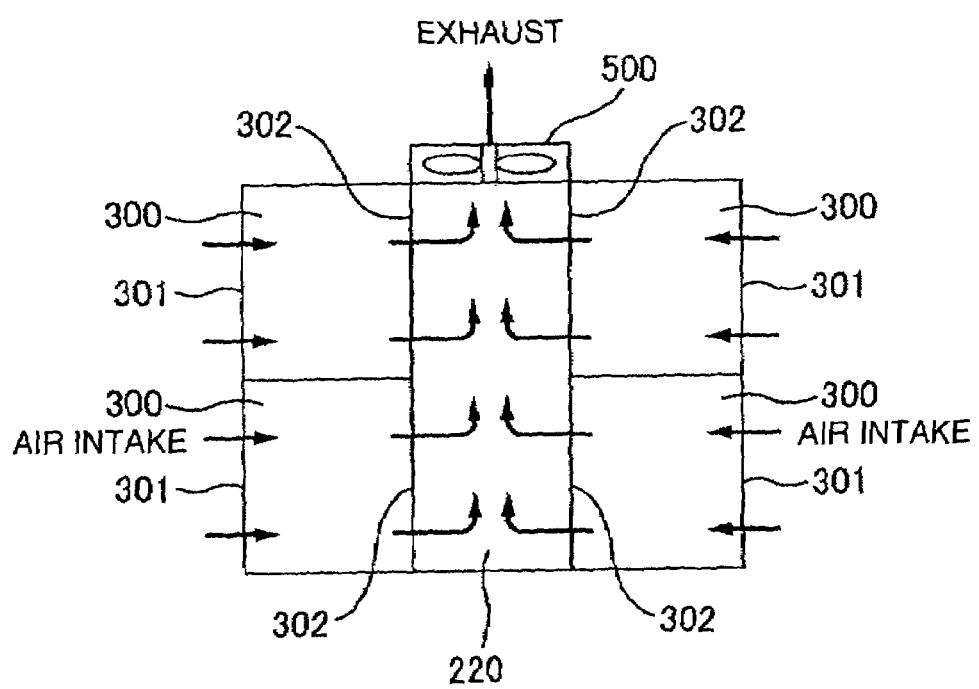
FIG. 21 is a diagram showing a draft path in a disk array apparatus according to the present embodiment.

How the air in the rack 200 is sucked in and exhausted to the outside by the fans 500 is shown in FIGS. 5 and 21. As indicated by arrows in FIGS. 5 and 21, the air in the rack 200 is sucked in by the fans 500 to pass through the air intake plane 301 of the disk drive module 300, the exhaust plane 302, and draft paths formed in the gap 220 so as to be opened consecutively in the suction direction of the fans 500, and exhausted to the outside of the rack 200.

As shown in FIG. 5, the air duct 210 is disposed in the gap 220 formed between a pair of disk drive modules 300 accommodated in the upper stage of the rack 200. The air duct 210 nearly takes the shape of a cylinder. The air duct 210 is disposed with its two opening planes being respectively opposed to sides located near the fans 500 and far from the fans 500. The plane on the side located far from the fans 500 is opposed to the gap 220 in the middle stage. As a result, the gap 220 in the upper stage in the rack 200 is separated from the gap in the middle stage. Since the air duct 210 is disposed in a gap 220 between a pair of disk drive modules 300 accommodated in a stage located nearer the fans 500, a draft path of air exhausted from exhaust planes 302 of two disk drive modules 300 accommodated in a stage located far from the fans 500 can be separated from a draft path of air exhausted from exhaust planes 302 of two disk drive modules 300 accommodated in a stage located near the fans 500. In other words, the air exhausted from the exhaust planes 302 of the pair of disk drive modules 300 accommodated in the stage located far from the fans 500 is passed through the inside of the air duct 210 and sucked in by the fans 500.

On the other hand, the air exhausted from the exhaust planes 302 of the pair of disk drive modules 300 accommodated in the stage located near the fans 500 is passed through the outside of the air duct 210 and sucked in by the fans 500. As a result, the air exhausted from the exhaust planes 302 of the two disk drive modules 300 accommodated in the stage located far from the fans 500 can be prevented from being mixed with the air exhausted from the exhaust planes 302 of the two disk drive modules 300 accommodated in the stage located near the fans 500. As a result, air flows in the rack 200 are put in order, and it becomes possible to exhaust air smoothly. Therefore, it becomes possible to improve the cooling efficiency of the disk array apparatus 200.

Furthermore, as shown in FIGS. 5 and 21, the fans 500 are disposed with nearly all surfaces of air intake ports of the fans 500 facing the draft paths. As a result, the air exhausted from the exhaust planes 302 of the disk drive modules 300, which has cooled the inside of the disk drive modules 300, can be sucked in by the fans 500 in a nearly straight line manner through the draft path formed in the gap 220. As a result, the draft resistance in the disk array apparatus 120 can be decreased, and the cooling efficiency of the disk array apparatus 120 can be improved. Since the cooling efficiency is improved, it also becomes possible to reduce the size of the fans 500. It also becomes possible to reduce the power dissipation, noise, cost and space of the disk array apparatus 120.

In addition, it is possible to form a suction space required for the fans 500 to suck in the air, in the gap 220 between the pair of opposed disk drive modules 300. Since it becomes unnecessary to provide a dedicated suction space, it becomes possible to reduce the size of the disk array apparatus 120 in the height direction accordingly.

Figure 17:
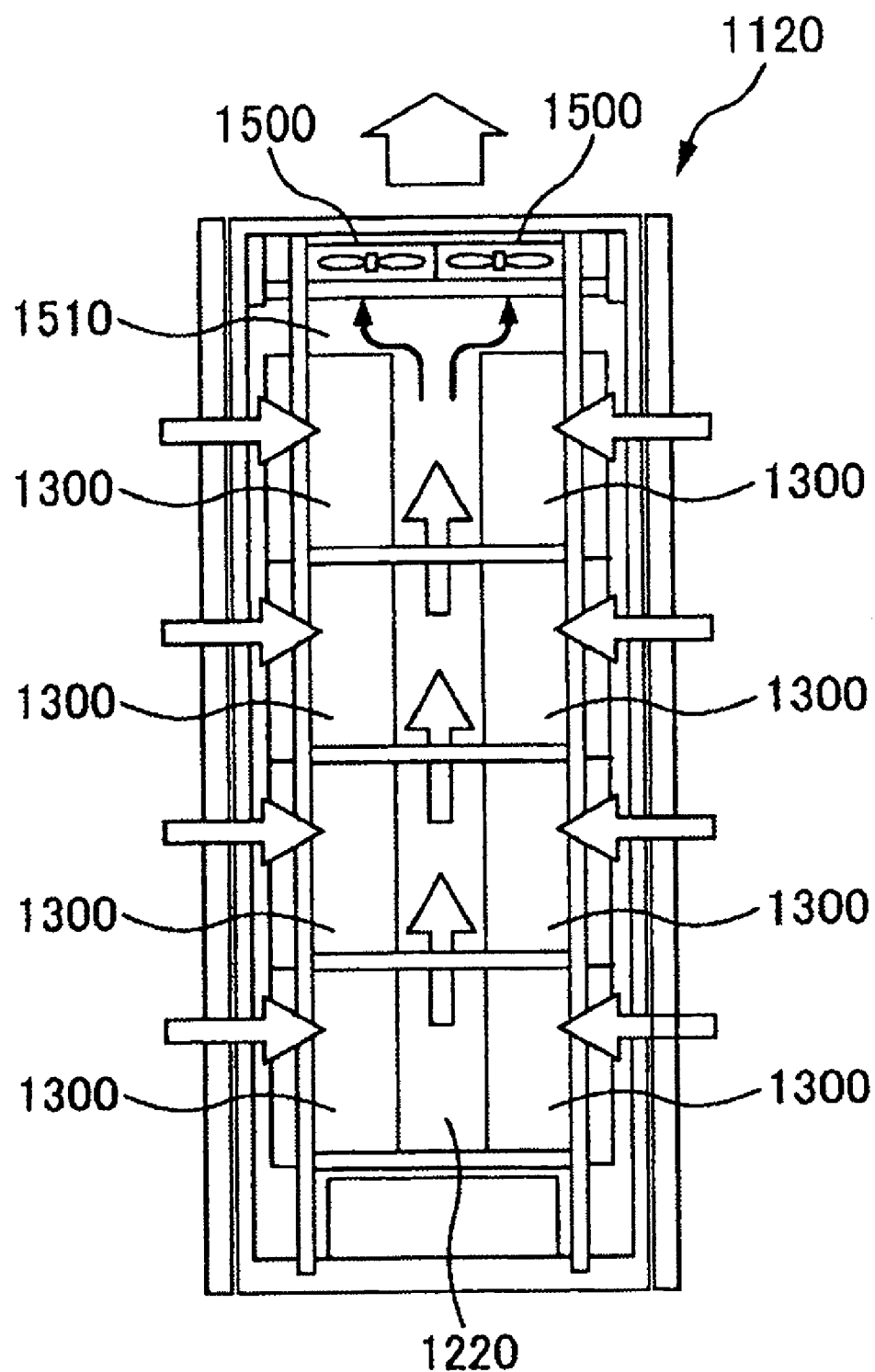
FIG. 17 is a diagram showing a draft path of a different disk array apparatus exhibited to show a comparison with a disk array apparatus of the present embodiment.
Figure 18:
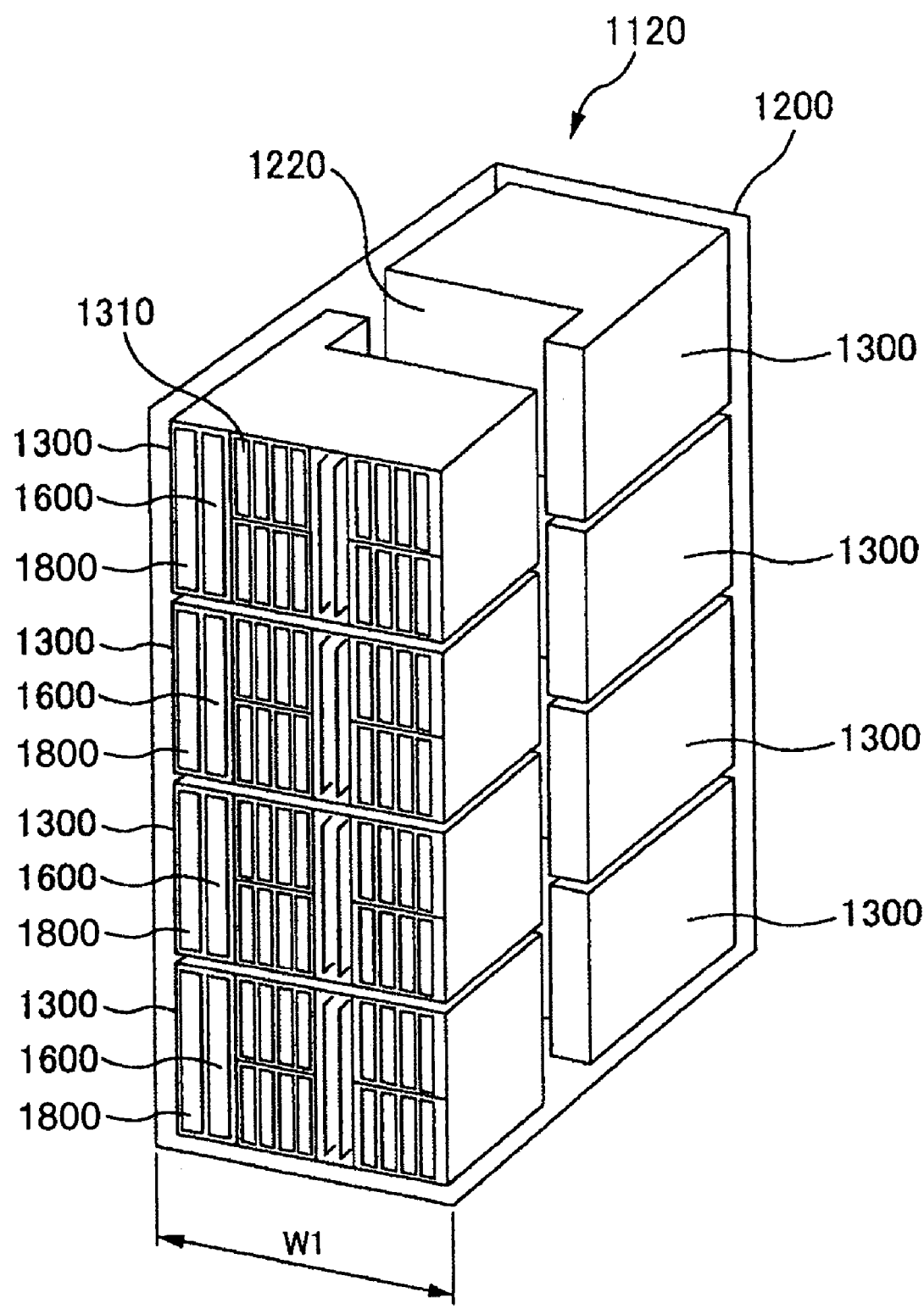
FIG. 18 is a diagram showing an internal configuration of the different disk apparatus.
Figure 19:
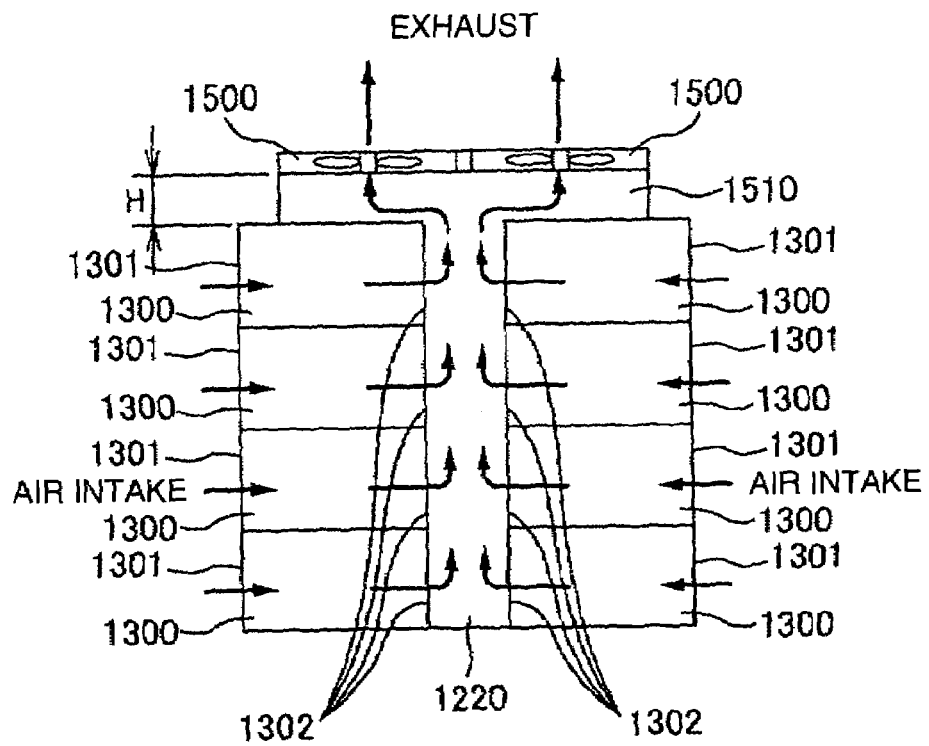
FIG. 19 is a diagram showing a draft path in the different disk apparatus.

An example of another disk array apparatus 1120 in which the fans 500 are disposed with nearly all surfaces of air intake ports of the fans being not made to face the draft paths is shown in FIGS. 17 to 19, for the purpose of description as compared with the disk array apparatus of the present embodiment.

In the same way as the disk array apparatus 120 according to the present embodiment, the disk array apparatus 1120 includes fans 1500 and disk drive modules 1300 in a rack 1200. A plurality of pairs of disk drive modules 1300 are accommodated in multiple stages of the rack 1200 with a pair of disk drive modules 1300 being opposed to each other in the horizontal direction via a gap 1220. Each of the disk drive modules 1300 nearly takes the shape of a rectangular solid. And a plurality of disk drives 1310 can be aligned and accommodated in each of the disk drive modules 1300 in a multi-stage form so as to be capable of being installed and removed. Each of the disk drive modules 1300 has an air intake plane 1301 through which air flows in, and an exhaust plane 1302 opposite to the air intake plane 1301. And each pair of the disk drive modules 1300 are arranged with their exhaust planes 1302 being opposed to each other. Furthermore, the rack 1200 accommodating the disk drive modules 1300 nearly takes the shape of a rectangular solid. And the rack 200 is formed so as to allow ventilation through its planes opposed to the air intake planes 1301 of the disk drive modules 1300. Therefore, each of the disk drive modules 1300 can take in air existing outside the rack 1200 from its air intake plane 1301, and exhaust the air from its exhaust plane 1302.

Furthermore, a DC power supply 1600 and a battery 1800 are accommodated in each of the disk drive modules 1300. As shown in FIG. 18, the disk drive module 1300 is longer in depth direction in a portion accommodating the DC power supply 1600 and the battery 1800 as compared with a portion accommodating disk drives 1310.

The fans 1500 are disposed in an upper part of the rack 1200. Unlike the disk array apparatus 120 according to the present embodiment, however, the fans 1500 are disposed with all surfaces of air intake ports of the fans 1500 being not made face the draft paths formed in the gap 1220. When the air is sucked in by the fans 1500, therefore, the flow path is bent as shown in FIGS. 17 and 19. Therefore, the ventilation resistance in the rack 1200 increases.

If the air intake planes of fans 1500 are blocked, the fans 1500 cannot suck in the air. In the disk array apparatus 1200, therefore, a chamber (suction space) 1510 for sucking in the air needs to be provided between the fans 1500 and the disk drive modules 1300 accommodated on the side near the fans 1500. As shown in FIG. 19, therefore, the disk array apparatus 1200 becomes larger in the height direction by the height of the chamber 1510.

On the other hand, in the disk array apparatus 120 according to the present embodiment, the fans 500 are disposed with nearly all surfaces of the air intake ports of the fans 500 facing the draft paths. As a result, the air exhausted from the exhaust planes 302 of the disk drive modules 300, which has cooled the inside of the disk drive modules 300, can be sucked in by the fans 500 in a nearly straight line manner through the draft path formed in the gap 220. As a result, the draft resistance in the disk array apparatus 120 can be decreased, and the cooling efficiency of the disk array apparatus 120 can be improved. Furthermore, since it becomes unnecessary to provide the chamber required for the fans 500 to suck in the air, it becomes possible to reduce the size of the disk array apparatus in the height direction.

Figure 20:
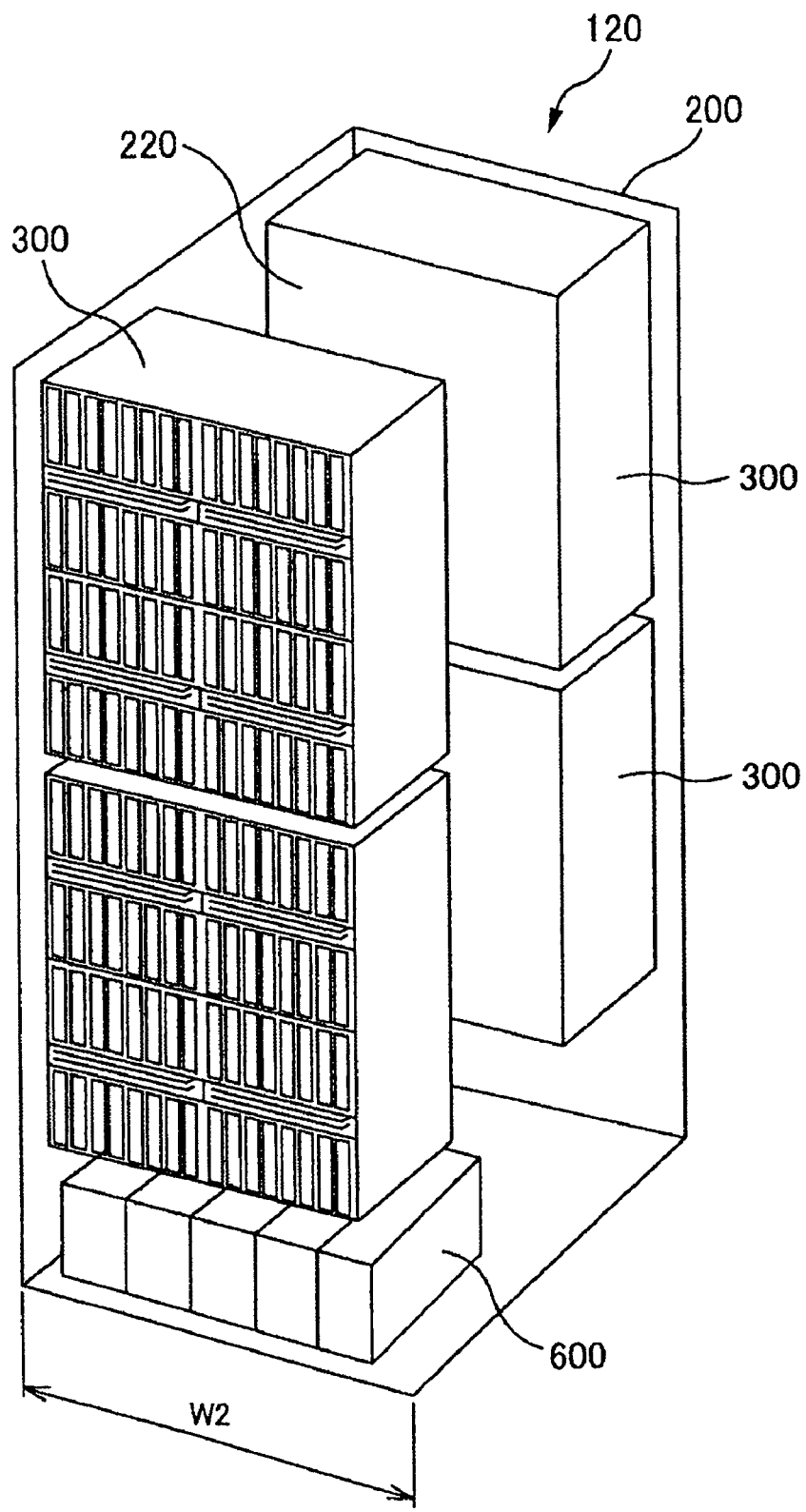
FIG. 20 is a diagram showing an internal configuration of a disk array apparatus according to the present embodiment.

Furthermore, as appreciated by comparing FIG. 18 with FIG. 20, the DC power supplies 600 are accommodated in a lower stage of the rack 200 in the disk array apparatus 120 according to the present embodiment. In the disk array apparatus 120 according to the present embodiment, therefore, its lateral width W2 can be made shorter than a lateral width W1 of the disk array apparatus 1200 shown in FIG.

18. In addition, since the size, in the depth direction, of the part of each disk drive module 1300 accommodating the DC power supply 1600 and the battery 1800 in the disk array apparatus 1200 shown in FIG. 18 can be eliminated, the gap 220 between the two disk drive modules 300 can be widened accordingly. As a result, the draft resistance in the rack 200 can be further decreased, and the cooling efficiency of the disk array apparatus 120 can be improved.

Adjustment of the flow rate of the air from the exhaust plane 302 of the disk drive module 300 conducted by the flow straightening plate 330 will now be described.

As shown in FIG. 5 or 21, the air from the exhaust planes 302 of the disk drive modules 300 is sucked in by the fans 500 through the draft path formed in the gap 220. At this time, the quantity of air sucked in by the fans 500 becomes large as the disk drive modules 300 are located nearer the fans 500. If the air suction quantity differs according to the distance from the fans 500, cooling in the disk array apparatus 120 becomes nonuniform. In that case, it is necessary to use high-output fans 500 capable of sufficiently cooling parts that are hardest to be cooled. In that case, there is a fear that the fans 500 might become large in size and noise and power dissipation might also increase.

In the disk array apparatus according to the present embodiment, the suction quantity of air exhausted from exhaust planes 302 of two disk drive modules 300 accommodated in a stage located far away from the fans 500 is made nearly equal to the suction quantity of air exhausted from exhaust planes 302 of two disk drive modules 300 accommodated in a stage located near the fans 500 by providing the air duct 120 in the gap 220 between the two disk drive modules 300 accommodated in the stage located near the fans 500.

In addition, the flow straightening plate 330 is disposed behind the exhaust plane 302 of each of the disk drive modules 300 in the upper stage or the middle stage, and thereby the flow rate of the air from the exhaust plane 302 of each of the disk drive modules 300 sucked in by the fans 500 is adjusted to make cooling in the disk array apparatus 120 uniform.

As shown in FIGS. 6 and 8, the vent holes 331 for adjusting the air flow rate are formed in the flow straightening plate according to the present embodiment. Supposing that the flow straightening plate 330 is virtually divided so as to correspond to stages of disk drives 310 accommodated in the disk drive module 300 in the multi-stage form, the vent holes 331 are formed so as to make the total area of the vent holes 331 in each virtual divisional flow straightening plate (virtual divisional resistance body) smaller as the virtual divisional flow straightening plate is located nearer the fans 500.

It will now be described more specifically with reference to the flow straightening plate 330 shown in FIGS. 6 and 8. First, the flow straightening plate 330 is divided into four virtual divisional flow straightening plates respectively associated with the stages of the disk drives 310. In a virtual divisional flow straightening plate of an upmost stage (a first virtual divisional flow straightening plate) located nearest the fans 500, vent holes 331a and vent holes 331b are formed. In a virtual divisional flow straightening plate (a second virtual divisional flow straightening plate) located secondly nearest the fans 500, vent holes 331c and vent holes 331d are formed. In a virtual divisional flow straightening plate (a third virtual divisional flow straightening plate) located thirdly nearest the fans 500, vent holes 331e and vent holes 331f are formed. In a virtual divisional flow straightening plate (a fourth virtual divisional flow straightening plate) located fourthly nearest the fans 500, vent holes 331g and vent holes 331h are formed. And the total area of the vent holes 331a and 331b in the first virtual divisional flow straightening plate is smaller than the total area of the vent holes 331c and 331d in the second virtual divisional flow straightening plate.

In the same way, the total area of the vent holes 331c and 331d in the second virtual divisional flow straightening plate is smaller than the total area of the vent holes 331e and 331f in the third virtual divisional flow straightening plate. The total area of the vent holes 331e and 331f in the third virtual divisional flow straightening plate is smaller than the total area of the vent holes 331g and 331h in the fourth virtual divisional flow straightening plate.

As a result, it is possible to adjust the flow rate of air sucked in from the exhaust plane 302 of the disk drive module 300 by the fans 500, and conduct cooling of the disk array apparatus 120 uniformly without depending upon the distance from the fans 500.

The total areas of the vent holes in the first, second, third and fourth virtual divisional flow straightening plates can be made to have the ratio of, for example, 0.75:0.82:0.91:1.0.

FIG. 10 shows the wind flow in a state in which a disk drive 310 is installed in the disk drive module 300. In FIG. 10, how air that has flowed in from the air intake plane 301 of the disk drive module 300 passes through side faces of one disk drive 310 and comes out from the vent holes 331 in a virtual divisional flow straightening plate is indicated by arrows. In the case where a plurality of disk drives 310 are accommodated in the disk drive module 300, the air that has flowed in from the air intake plane 301 of the disk drive module 300 is passed through space between side faces of the disk drives 310 and exhausted from the vent holes 331 in the virtual divisional flow straightening plate.

Figure 11:
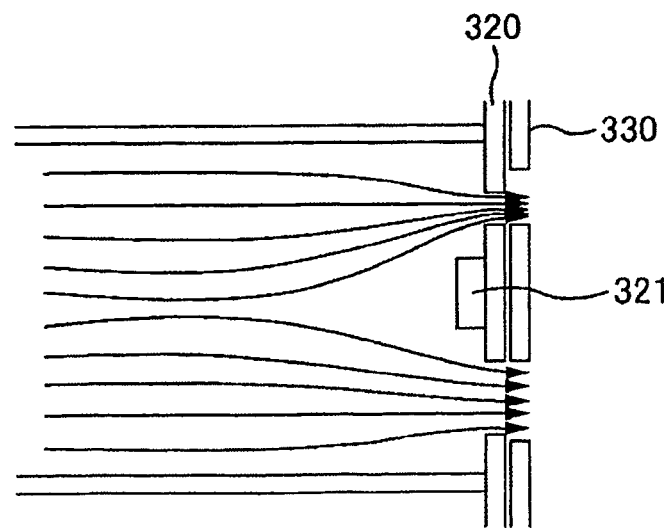
FIG. 11 is a diagram showing how cooling wind flows according to the present embodiment.
Figure 16:
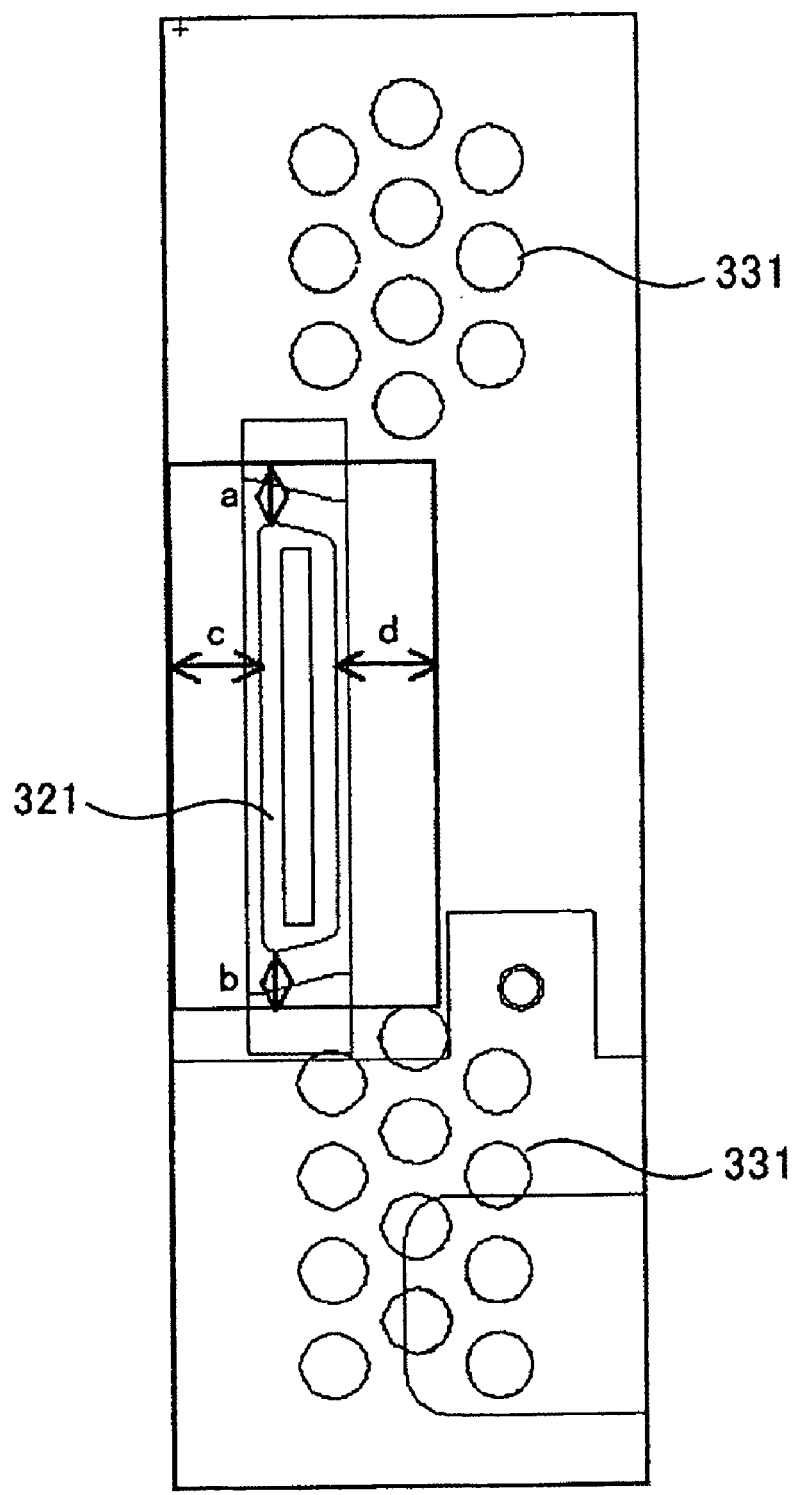
FIG. 16 is a diagram showing an arrangement of vent holes in a flow straightening plate according to the present embodiment.

In the present embodiment, the vent holes 331 in each virtual divisional flow straightening plate are provided so as not to apply wind to connectors 321 on the circuit board 320 as shown in FIG. 11. Specifically, the vent holes 331 are disposed so as to be separated from the contour of the connector 321 formed on the flow straightening plate 330 when the shape of the connector 321 is projected onto the flow straightening plate 330 in a state in which the circuit board 320 and the flow straightening plate 330 are attached to the disk drive module 300. Its situation is shown in FIG. 16. The vent holes 331 are disposed so as to separate them from the contour of the connector 321 projected onto the flow straightening plate 330 by dimensions of "a," "b," "c" and "d." The dimensions of "a," "b," "c" and "d" can be set equal to, for example, 8 mm, 8 mm, 12 mm and 12 mm, respectively.

As a result, it is possible to prevent wind from being applied to the connector 321. Therefore, it is possible to prevent dust floating in the air from adhering to the connector 321 and exhaust the dust, and the cooling efficiency of the disk array apparatus 120 can be improved. Furthermore, since adherence of dust to the contact 321 can be prevented, electrical troubles in the disk array apparatus 120 can be prevented and the reliability can also be improved.

In addition, the vent holes 331 are provided in each virtual divisional flow straightening plate so as to reduce the air flow rate as the vent holes are located nearer the fans 500. In other words, the total area of the vent holes 331 disposed in a position nearer the fans 500 than the connector 321 is smaller than the total area of the vent holes 331 disposed in a position farther from the fans 500 than the connector 321. Specifically, in FIG. 6, the total area of the vent holes 331a is smaller than the total area of the vent holes 331$b$. In the same way, the total area of the vent holes 331$c$ is smaller than the total area of the vent holes 331$d$. The total area of the vent holes 331$e$ is smaller than the total area of the vent holes 331$f$. The total area of the vent holes 331$g$ is smaller than the total area of the vent holes 331$h$.

By doing so, the difference in air suction quantity according to the distance from the fans 500 can be reduced in each of the stages in the disk drive module 300, which accommodates disk drives 310 in the multi-stage form. As a result, it becomes possible to conduct cooling of the disk array apparatus 120 further uniformly, and it becomes possible to improve the cooling efficiency. Furthermore, by doing so, it becomes possible to prevent dust that is floating near the bottom face in each stage in the disk drive module 300 and that is heavier than the air from adhering to the connector 321, and exhaust the dust from the vent holes 331.

The ratio between the area of the vent holes 331$a$ and the area of the vent holes 331$b$ can be set to, for example, 0.6:1.0. The ratio between the area of the vent holes 331$c$ and the area of the vent holes 331$d$ can be set to, for example, 0.75:1.0. The ratio between the area of the vent holes 331$e$ and the area of the vent holes 331$f$ can be set to, for example, 0.85:1.0. The ratio between the area of the vent holes 331$g$ and the area of the vent holes 331$h$ can be set to, for example, 0.95:1.0.

Figure 12:
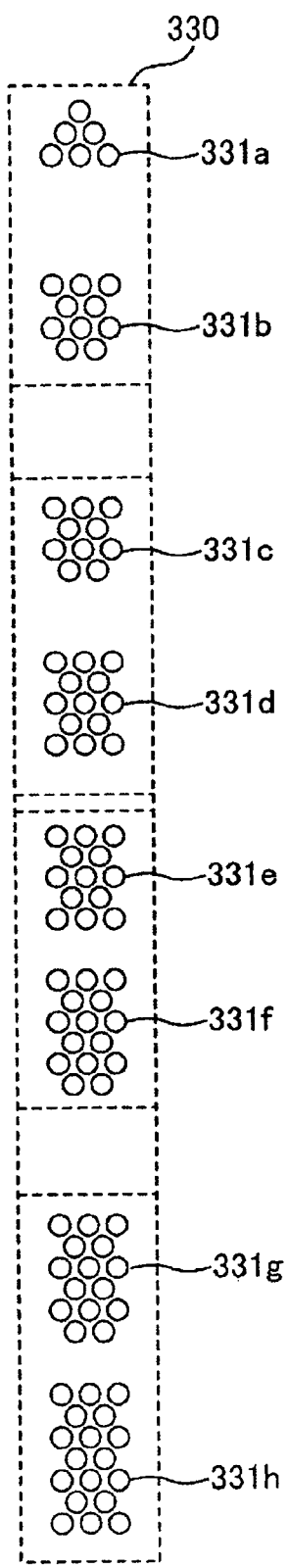
FIG. 12 is a diagram showing an example of vent holes in a flow straightening plate according to the present embodiment.
Figure 13:
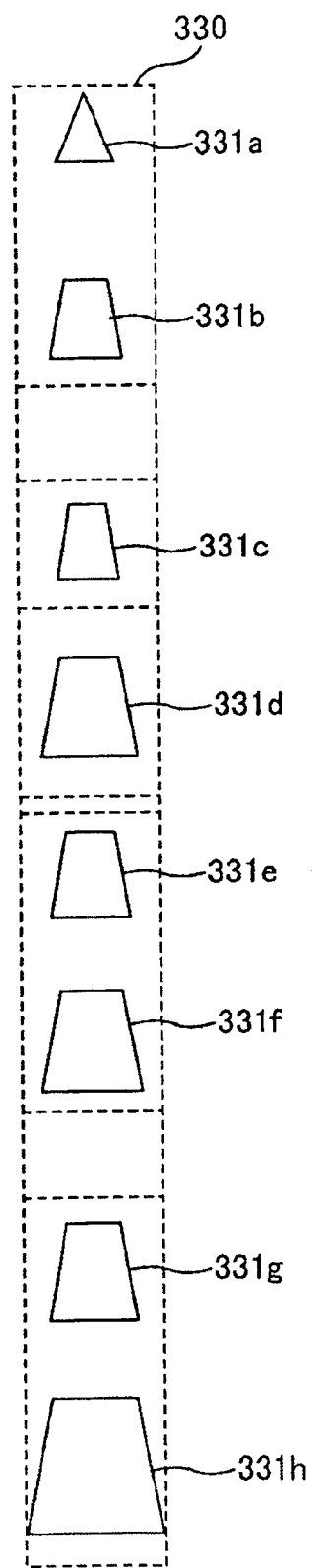
FIG. 13 is a diagram showing an example of vent holes in a flow straightening plate according to the present embodiment.
Figure 14:
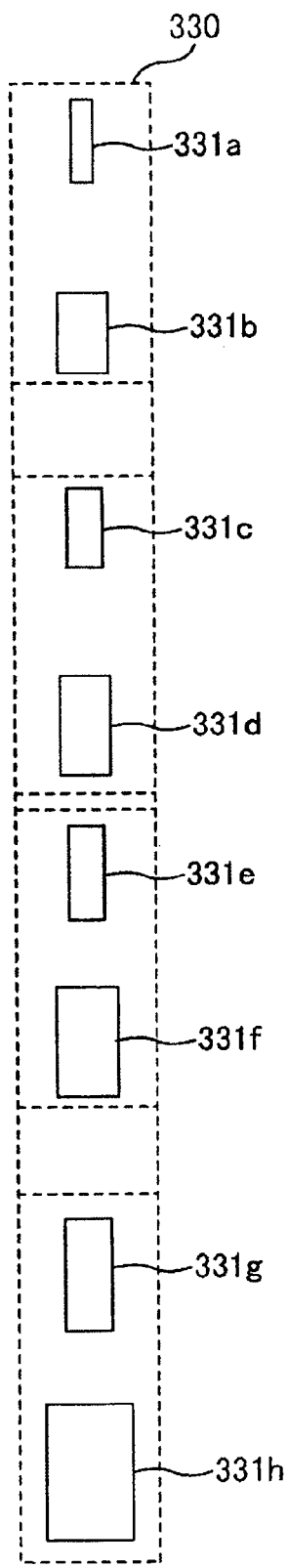
FIG. 14 is a diagram showing an example of vent holes in a flow straightening plate according to the present embodiment.
Figure 15:
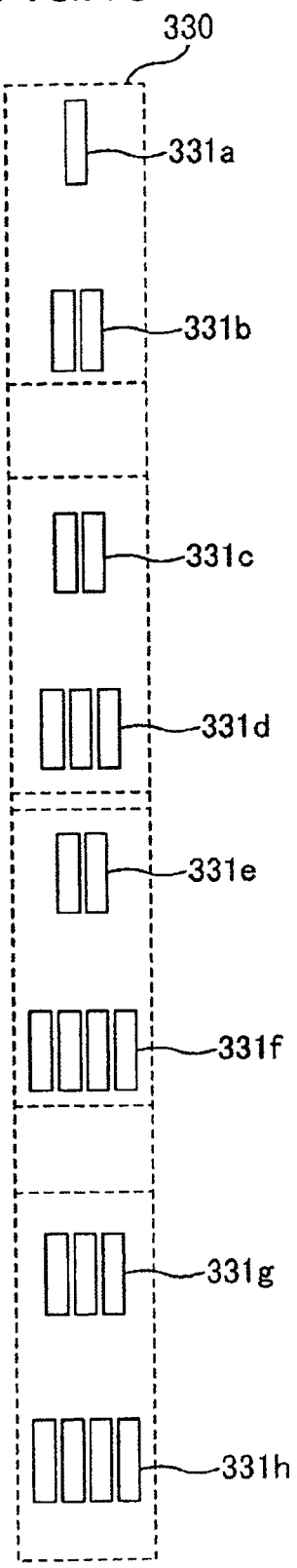
FIG. 15 is a diagram showing an example of vent holes in a flow straightening plate according to the present embodiment.

As for the shape of the vent holes 331 in the flow straightening plate 330, it may be a shape formed by gathering a plurality of circular holes as shown in FIG. 6 or FIG. 12. When the vent holes 331 have such shapes, there is an advantage that working is easy. It is also possible to avoid concentration of stress in the flow straightening plate 330. The shape of the vent holes 331 in the flow straightening plate 330 may also be a shape formed by gathering a plurality of hexagonal holes, i.e., the so-called honeycomb shape. In this case, the ratio of the total area of the vent holes 331 to the area of the whole flow straightening plate 330 can be increased as compared with the case of the circular holes. As shown in FIG. 13, the shape of the vent holes 331 may also be a trapezoid in which the length of a side located nearer the fans 500 is shorter than the length of a side located farther from the fans 500. In this case, there is an advantage that the labor for boring working can be relatively reduced. Furthermore, since each vent hole 331 is large, there is also an advantage that dust is hard to adhere to the flow straightening plate 330. As shown in FIG. 13, vent holes 331 each taking the shape of a trapezoid and a vent hole 331 taking the shape of a triangle may be used mixedly. As shown in FIG. 14 or 15, the vent holes 331 may take the shape of a rectangle or rectangles. In the case of the vent holes 331 shown in FIG. 14, there is an advantage that the labor of the boring work can be relatively reduced. Furthermore, since each vent hole is large, there is also an advantage that dust is hard to adhere to the flow straightening plate 330. In the case of the vent holes 331 shown in FIG. 15, there is an advantage that working is easy because elementary holes in the vent holes 331 are the same.

Heretofore, the best mode for carrying out the invention has been described. However, the embodiment is shown to facilitate understanding of the present invention, and it is not construed to restrict and interpret the present invention. The present invention can be altered and reformed without departing from the spirit thereof. In addition, the present invention incorporates its equivalent.

What is claimed is:

1. A disk array apparatus comprising:
    a plurality of disk boxes each generally taking the shape of a rectangular solid, and each having an air intake plane through which air flows in and an exhaust plane provided at an end opposite to that of the air intake plane, a plurality of disk drives being aligned and installed in each of the disk boxes;
    a rack generally taking the shape of a rectangular solid, disk units being accommodated in said rack so as to form a plurality of stages in a vertical direction, each of the disk units being formed by putting two of the disk boxes back to back with a gap therebetween in a horizontal direction with the exhaust planes respectively of the two disk boxes being opposed to each other, ventilation being created to flow through planes of said rack respectively perpendicular to the air intake planes of the disk boxes and then through a top plane of said rack, a draft path having a width generally equivalent to a lateral width of said rack and extending in the vertical direction being formed by the gaps of the disk units accommodated in said rack; and
    an exhaust device disposed at an upper part of said rack, air within said rack being sucked in from the air intake planes of the disk boxes by said exhaust device so as to pass through the exhaust planes of the disk boxes and the draft path, and being exhausted through the top plane of said rack to outside by said exhaust device,
    wherein said exhaust device is disposed with a substantially entire surface of an air intake port of said exhaust device facing a cross-section of the draft path,
    the disk drives are installed in each of the disk boxes in a multi-stage form,
    a flow straightening plate is disposed behind the exhaust planes of the disk boxes, the flow straightening plate has a plurality of vent holes to adjust a flow rate of the air sucked in by said exhaust devices, and
    when the flow straightening plate is virtually divided into a plurality of divisional portions so as to correspond to the stages of disk drives, a total area of the vent holes in a divisional portion located near said exhaust device is smaller than a total area of the vent holes in a divisional portion located far from said exhaust device.

2. The disk array apparatus according to claim 1, wherein, in each of the divisional portions, a total area of the vent holes in a position located nearer said exhaust device is smaller than a total area of the vent holes in a position located farther from said exhaust device.

3. The disk array apparatus according to claim 1, wherein a circuit board having connectors to electrically connect the disk drives is disposed between the exhaust planes of the disk boxes and the flow straightening plate, and the vent holes in the flow straightening plate are disposed so as to be separated from the projected contour of each of the connectors.

4. The disk array apparatus according to claim 1, wherein each of said vent holes generally takes a shape of a circle.

5. The disk array apparatus according to claim 1, wherein each of said vent holes generally takes a shape of a rectangle.

6. The disk array apparatus according to claim 1, wherein a contour defined by said vent holes generally takes a shape of a rectangle.

7. The disk array apparatus according to claim 1, wherein each of said vent holes generally takes a shape of a trapezoid or a triangle.

* * * * *